(12) United States Patent
Chen et al.

(10) Patent No.: US 9,638,716 B2
(45) Date of Patent: May 2, 2017

(54) POSITIONER OF PROBE CARD AND PROBE HEAD OF PROBE CARD

(71) Applicant: MPI Corporation, Hsinchu County (TW)

(72) Inventors: Tzu-Yang Chen, Hsinchu County (TW); Shang-Jung Hsieh, Hsinchu County (TW); Chung-Tse Lee, Hsinchu County (TW); Tsung-Yi Chen, Hsinchu County (TW); Tien-Chia Li, Hsinchu County (TW); Chia-Yuan Kuo, Hsinchu County (TW); Che-Wei Lin, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 370 days.

(21) Appl. No.: 14/558,735

(22) Filed: Dec. 3, 2014

(65) Prior Publication Data

US 2015/0377926 A1 Dec. 31, 2015

(30) Foreign Application Priority Data

Jun. 27, 2014 (TW) .............................. 103122324 A

(51) Int. Cl.
*G01R 1/073* (2006.01)
*G01R 31/28* (2006.01)
(52) U.S. Cl.
CPC ..... *G01R 1/07364* (2013.01); *G01R 31/2891* (2013.01)
(58) Field of Classification Search
CPC ...... G01R 1/073; G01R 1/07364; G01R 3/00; G01R 31/28; G01R 31/2891; G01R 31/2808; G01R 1/07371; G01R 1/07357; G01R 1/07342; G01R 1/07378; G01R 1/067; G05B 2219/36048; G05B 2219/37222

See application file for complete search history.

(56) References Cited

U.S. PATENT DOCUMENTS

| 7,301,354 | B2 * | 11/2007 | Crippa ............... | G01R 1/06733 324/754.11 |
| 2014/0266275 | A1 * | 9/2014 | Kimura ............... | G01R 1/07357 324/750.25 |

FOREIGN PATENT DOCUMENTS

| JP | 2002296297 | 10/2002 |
| JP | 2002357207 | 12/2002 |
| TW | I299790 | 8/2008 |

* cited by examiner

*Primary Examiner* — Son Le
(74) *Attorney, Agent, or Firm* — Jianq Chyun IP Office

(57) ABSTRACT

A positioner and a probe head of a probe card are provided. The positioner has a main opening, a first sub-opening, a second sub-opening, a third sub-opening, a fourth sub-opening, a first positioning portion, a second positioning portion, a first elastic portion and a second elastic portion. The first sub-opening, the second sub-opening, the third sub-opening, and the fourth sub-opening are sequentially arranged at the periphery of the main opening and are communicated to the main opening. A stiffness of the first positioning portion and a stiffness of the second positioning portion are higher than a stiffness of the first elastic portion and a stiffness of the second elastic portion.

15 Claims, 15 Drawing Sheets

POSITIONER OF PROBE CARD AND PROBE HEAD OF PROBE CARD

CROSS-REFERENCE TO RELATED APPLICATION

This application claims the priority benefit of Taiwan application serial no. 103122324, filed on Jun. 27, 2014. The entirety of the above-mentioned patent application is hereby incorporated by reference herein and made a part of this specification.

BACKGROUND OF THE INVENTION

1. Field of the Invention

The present invention generally relates to a positioner and a probe head, and more particularly, to a positioner of a probe card and a probe head of a probe card.

2. Description of Related Art

Semiconductor integrated circuit chip typically adopts a probe card to perform an electrical testing. The probe card includes a printed circuit board, a space transformer and a probe head. The probe head at least includes an upper guide plate, a lower guide plate and a plurality of probes. The upper guide plate and the lower guide plate of the probe head typically have a plurality of through holes, and each through hole can only be passed by a single probe. Thus, when a under test contact pitch of the chip becomes smaller, a corresponding testing pitch of the probe head must also become smaller in correspondence, so as to be qualified as a fine pitch.

As shown in FIG. 1, a typical probe head 80 that is used in testing the semiconductor chip includes an upper guide plate 81, a lower guide plate 82 and a plurality of probes 90. As shown in FIG. 2, a cross-section of a head portion 92 of each probe 90 substantially appears to be a circle, and a cross-section of a body portion 94 of each probe 90 substantially appears to be an ellipse or a rectangle; and in order to facilitate in an assembling of each component of the probe head 80, the head portion 92 of each probe 90 is usually positioned in a positioner 84 in the first, wherein the positioner 84 has a plurality of openings 85 passing through the positioner 84. A shape of each opening 85 is formed by superimposing a circle and an ellipse. The circular portion in the each opening 85 is similar to a cross-sectional shape of the head portion 92 of each probe 90. The head portion 92 of each probe 90 is inserted into each opening 85 of the positioner 84, so that the openings 85 may constrain the probes 90 and further be disposed into upper through holes 86 of the upper guide plate 81, thereby enabling the body portion 94 of each probe 90 to extend to the lower guide plate 82.

When assembling the probe head 80, each probe 90 can pass through each opening 85 of the positioner 84 after the positioner 84 is firstly disposed at the lower guide plate 82, and the body portion 94 of each probe 90 that appears to be in an elliptical cross-sectional shape would also pass through the elliptical portion of each opening 85 so as to prevent each probe 90 from producing structural damage due to having mutual interference contacts with a wall-surface of each opening 85. However, after gone through practical application, it is discovered that the openings 85 are unable to produce an effective positioning effect to the head portions 92 of the probes 90, and thus is due to the reason that the head portions 92 of the probes 90 would move from the circular portions of the openings 85 towards the elliptical portions just by being subjected to a little force. As a result, all the probes 90 would shake or deviate from the positions due to the reason that the openings 85 being too large, thereby causing the head portions 92 of all the probes 90 unable to be uniformly aligned and pass through the upper through holes 86 of the upper guide plate 81; and therefore, the positioning effect of the probes 90 is poor, difficulty in assembling is increased, and a product yield is lowered.

On the other hand, it can be seen from FIG. 3 that, enlarged openings 85 would cause a distance D10 between the openings 85 to be shortened. In a probe head 80 that adopts the fine pitch as depicted in FIG. 1 without increasing the pitch, if it is to switch to the probe 90 with a larger probe diameter, then the distance D10 between the openings 85 would be shortened even more, thereby causing a significant increase in the probability of cracking at this certain location of the positioner 84; and as a result, the difficulty in assembling is further increased, and the product yield is further lowered. Therefore, how to effectively solve the aforementioned shortcomings is the foremost goal in need to be addressed by related practitioners.

SUMMARY OF THE INVENTION

The present invention is directed to a positioner of a probe card, wherein the positioner is configured to assemble the probe card that is used for testing a device under test having a fine pitch contact.

The present invention is directed to a probe head of a probe card, wherein a positioner used by the probe head may be configured to assemble the probe card that is used for testing a device under test having a fine pitch contact.

The present invention is directed to a positioner of a probe card. The positioner has a main opening, a first sub-opening, a second sub-opening, at least one positioning portion, and at least one elastic portion, wherein the first sub-opening and the second sub-opening are arranged at the periphery of the main opening and communicated to the main opening, the at least one positioning portion and the at least one elastic portion are complementary of each other, the at least one elastic portion is between the first sub-opening and the second sub-opening, and a stiffness of the at least one positioning portion is higher than a stiffness of the at least one elastic portion.

The present invention is directed to a probe head of a probe card. The probe head includes an upper guide plate, a lower guide plate, an aforementioned positioner, and a plurality of probes. The upper guide plate has a plurality of upper through holes. The lower guide plate is located at a side of the upper guide plate and has a plurality of lower through holes. The positioner is located between the upper guide plate and the lower guide plate, and has plurality of the main openings. Each probe is positioned between one upper through hole of the upper guide plate and one lower through hole of the lower guide plate, and passes through one main opening of the positioner.

In view of the above, the positioner of the present invention may provide the probes with favorable positioning effect while not damaging the probes easily, and a pitch between openings of the positioner would not crack easily. Accordingly, difficulty in assembling the probe head of the probe card is lowered, and a product yield of the probe head of the probe card is also increased.

To make the aforementioned and other features and advantages of the application more comprehensible, several embodiments accompanied with drawings are described in detail as follows.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF THE EMBODIMENTS

Figure 4A:
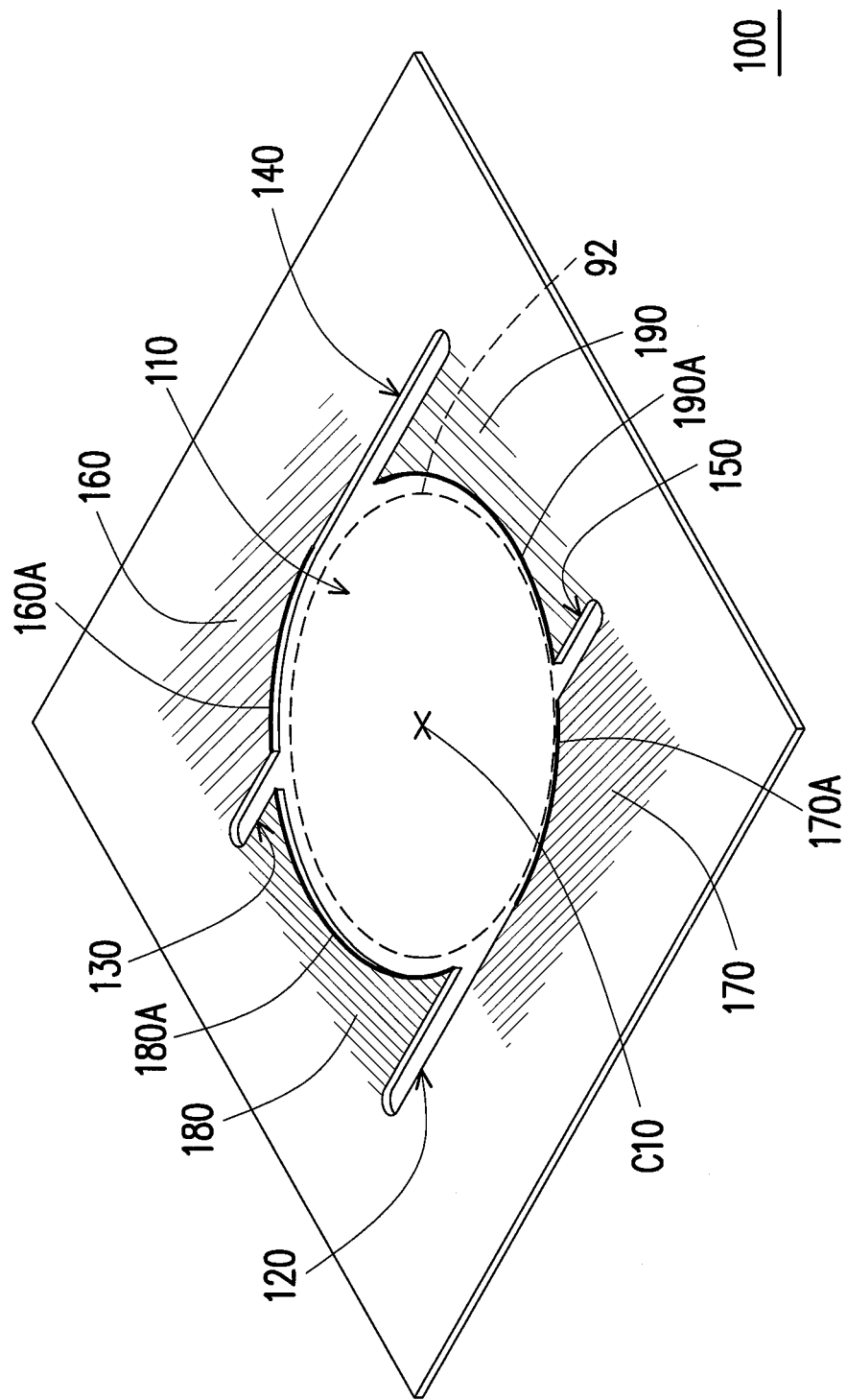
FIG. 4A is a partial perspective view illustrating a positioner of a probe card according to an embodiment of the present invention.

Referring to FIG. 4A, a positioner 100 of a probe card of the present embodiment has a main opening 110, a first sub-opening 120, a second sub-opening 130, a third sub-opening 140, a fourth sub-opening 150, a first positioning portion 160, a second positioning portion 170, a first elastic portion 180, and a second elastic portion 190. The first sub-opening 120, the second sub-opening 130, the third sub-opening 140, and the fourth sub-opening 150 are sequentially arranged at the periphery of the main opening 110, and the first sub-opening 120, the second sub-opening 130, the third sub-opening 140 and the fourth sub-opening 150 are all communicated to the main opening 110. Taking the first sub-opening 120 being communicated to the main opening 110 as an example, the term "communicated" herein indicates that the first sub-opening 120 is directly connected with the main opening 110, and there is no other barrier between the two. It is to be explained that, the positioner has a plurality of main openings and a plurality of sub-openings thereon. However, in the present embodiment or other embodiments of the present invention, for the simplification and the clarify of illustration, the descriptions are provided by taking only one main opening and one first sub-opening, one second sub-opening, one third sub-opening, and one fourth sub-opening that are communicated to the main opening, or with only one main opening and one first sub-opening and one second sub-opening that are communicated to the main opening, into account.

The first elastic portion 180 is between the first sub-opening 120 and the second sub-opening 130. That is, three sides of the first elastic portion 180 respectively locate the main opening 110, the first sub-opening 120 and the second sub-opening 130, while a remaining side of the first elastic portion 180 is connected to other portion of the positioner 100. The first positioning portion 160 is between the second sub-opening 130 and the third sub-opening 140. That is, three sides of the first positioning portion 160 respectively locate the main opening 110, the second sub-opening 130 and the third sub-opening 140, while a remaining side of the first positioning portion 160 is connected to other portion of the positioner 100. The second elastic portion 190 is between the third sub-opening 140 and the fourth sub-opening 150. That is, three sides of the second elastic portion 190 respectively locate the main opening 110, the third sub-opening 140 and the fourth sub-opening 150, while a remaining side of the second elastic portion 190 is connected to other portion of the positioner 100. The second positioning portion 170 is between the first sub-opening 120 and the fourth sub-opening 150. That is, three sides of the second positioning portion 170 respectively locate the main opening 110, the first sub-opening 120 and the fourth sub-opening 150, while a remaining side of the second positioning portion 170 is connected to other portion of the positioner 100. In the present embodiment, the first positioning portion 160 and the second positioning portion 170 appear to be oppositely disposed, and the first elastic portion 180 and the second elastic portion 190 appear to be oppositely disposed.

The first positioning portion 160, the second positioning portion 170, the first elastic portion 180, and the second elastic portion 190 all include a portion of the periphery of the main opening 110. The first positioning portion 160, the second positioning portion 170, the first elastic portion 180, and the second elastic portion 190 are further complementary of each other; and the term "complementary" herein indicates that the first positioning portion 160, the second positioning portion 170, the first elastic portion 180, and the second elastic portion 190 together constitute the entire periphery of the main opening 110. In terms of the present embodiment, the first positioning portion 160, the second positioning portion 170, the first elastic portion 180, and the second elastic portion 190 together constitute the entire periphery of the main opening 110, except the portions that are communicated to the first to fourth sub-openings 120-150.

Figure 1:
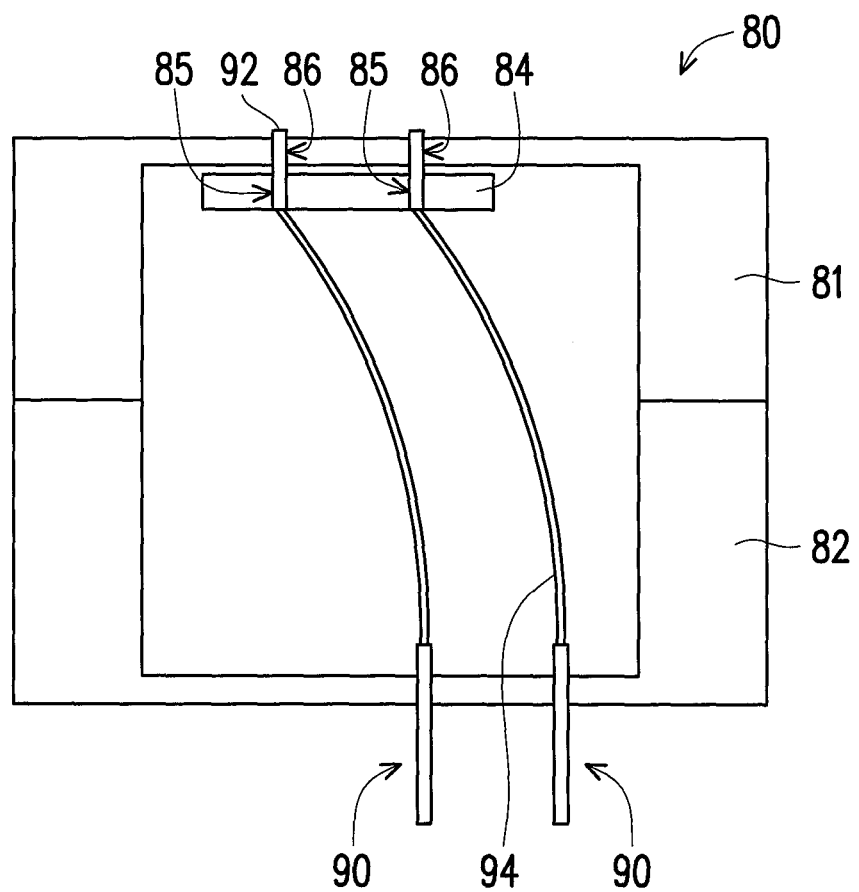
FIG. 1 is a schematic view of a conventional probe head.
Figure 2:
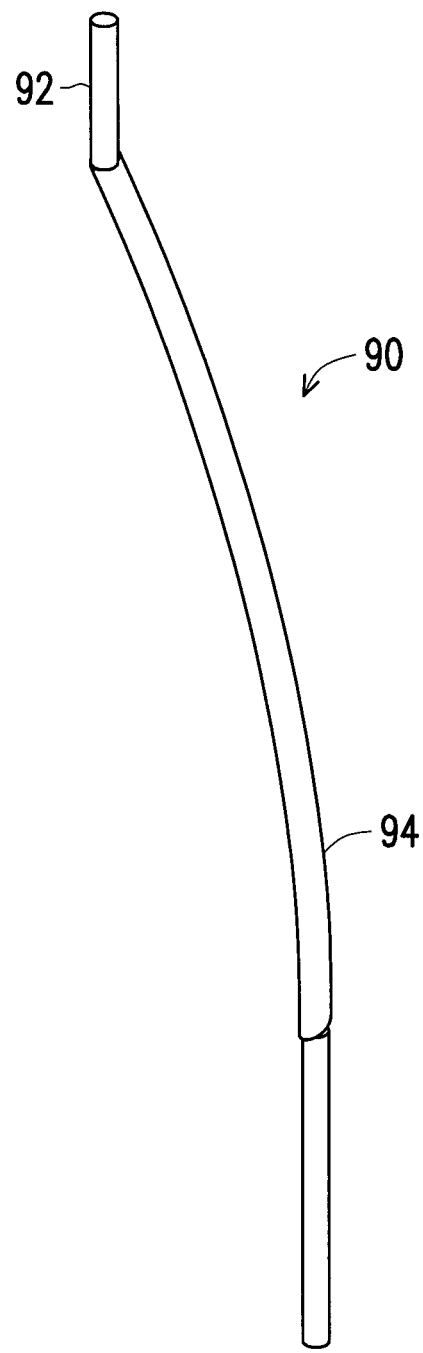
FIG. 2 is a perspective view a conventional probe.
Figure 4B:
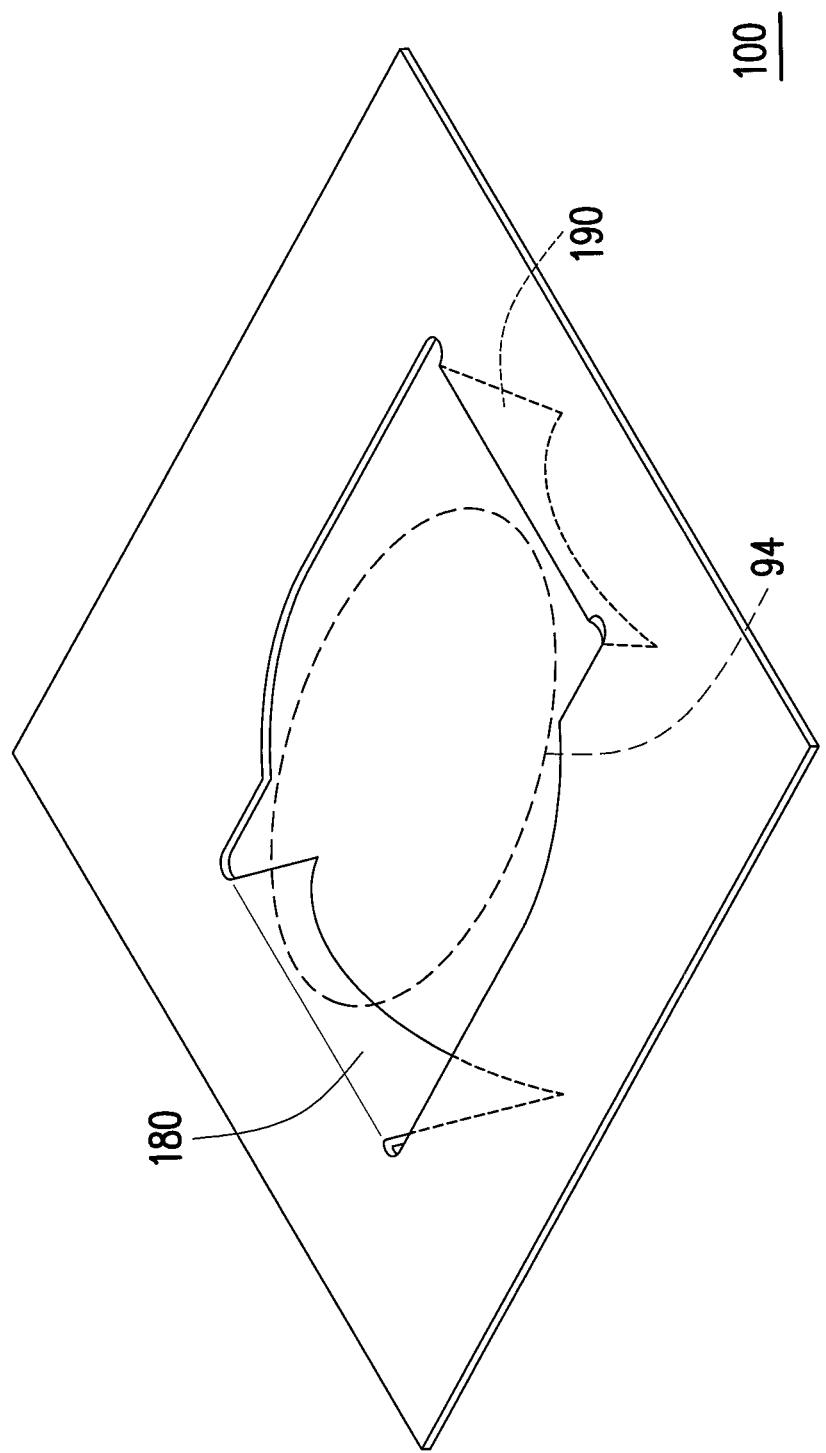
FIG. 4B is a schematic view illustrating another mode of the positioner depicted in FIG. 4A.

In the positioner 100 of the probe card of the present embodiment, a stiffness of the first positioning portion 160 and a stiffness of the second positioning portion 170 are higher than a stiffness of the first elastic portion 180 and a stiffness of the second elastic portion 190. Referring to FIG. 2, FIG. 4A and FIG. 4B at the same time, when the body portion 94, which has an elliptical cross-section, of the probe 90 as shown in FIG. 2 passes through the main opening 110, the first elastic portion 180 and the second elastic portion 190 that have the lower stiffness would be bended in a manner as shown FIG. 4B when being subjected to force, and thereby prevent the positioner 100 or the probe 90 from being damaged due to having an excessive force being generated from between the positioner 100 and the body portion 94 of the probe 90. After the body portion 94 of the probe 90 as shown FIG. 2 completely passes through the main opening 110, the head portion 92 of the probe 90 does not oppress the first elastic portion 180 and the second elastic portion 190, and thus the first elastic portion 180 and the second elastic portion 190 would return back to the original state as shown in FIG. 4A. When the first elastic portion 180 and the second elastic portion 190 return back to the original state as shown in FIG. 4A, the head portion 92 of the probe 90 would then be located at the main opening 110. In addition, the first positioning portion 160 of the present embodiment has a first positioning side 160A at the periphery of the main opening 110, the second positioning portion 170 has a second positioning side 170A at the periphery of the main opening 110, the first elastic portion 180 has a first elastic side 180A at the periphery of the main opening 110, and the second elastic portion 190 has a second elastic side 190A at the periphery of the main opening 110. The first positioning side 160A, the second positioning side 170A, the first elastic side 180A, and the second elastic side 190A are configured to support the head portion 92 of the probe 90. In other words, the first positioning side 160A, the second positioning side 170A, the first elastic side 180A, and the second elastic side 190A together constitute the entire periphery of the main opening 110, except the portions that are communicated to the first to fourth sub-openings 120-150. When the head portion 92 of the probe 90 as shown in FIG. 2 is located at the main opening 110, the first positioning side 160A, the second positioning side 170A, the first elastic side 180A, and the second elastic side 190A together provide sufficient positioning force so as to limit the head portion 92 of the probe 90 at the main opening 110. As such, it is ensured that the positioner 100 may provide sufficient positioning force to the head portion 92 of the probe 90, so that the head portion 92 of the probe 90 may be prevented from assembling failure or being damaged due to position deviation during the subsequently assembling process. A sum of side lengths of the first elastic side 180A and the second elastic side 190A may be greater than or equal to a sum of side lengths of the first positioning side 160A and the second positioning side 170A, and this may be designed according to the actual needs, such that the present invention is not limited thereto. It is to be noted that, the majority of the embodiments of the present invention all include positioning sides and elastic sides similar to that of the present embodiment, but only the ones in the present embodiment are taken as an example for providing the detailed descriptions, such that no repetition will be provided later on.

In the present embodiment, a shape of the main opening 110 of the positioner 100 generally has to match a cross-sectional shape (such as a circle) of the head portion of the probe that is to be constrained, but the present invention does not intend to limit the shape of the main opening. In the present embodiment, since the first positioning portion 160, the second positioning portion 170, the first elastic portion 180, and the second elastic portion 190 are complementary of each other, the shapes thereof are designed in a manner to support the probe, and thereby can provide favorable positioning effect to the head portion of the probe. Moreover, the positioner 100 of the present embodiment, for example, takes the form of a thin film, and a material thereof, for example, may be polyimide. The main opening 110, the first sub-opening 120, the second sub-opening 130, the third sub-opening 140, and the fourth sub-opening 150 of the positioner 100 may be formed by machining, such as laser machining, stamping and so forth, or directly be formed at the positioner 100 by means of photolithography. In the present embodiment, the first sub-opening 120, the second sub-opening 130, the third sub-opening 140, and the fourth sub-opening 150 are straight strip-shaped. The definition of "straight strip-shaped" generally indicates that a width thereof in a direction perpendicular to an extending direction remains a constant. Moreover, an end of the first sub-opening 120, an end of the second sub-opening 130, an end of the third sub-opening 140, and an end of the fourth sub-opening 150 away from the main opening 110, preferably, respectively have an arc-shaped edge. For instance, if the sub-openings are cracks, then the cracks may continue to grow along a cracking direction due to stress concentration after the cracks are subjected to force; and thus, the first sub-opening 120, the second sub-opening 130, the third sub-opening 140, and the fourth sub-opening 150 should preferably be straight strip-shaped, and the ends thereof away from the main opening 110 should preferably have the arc-shaped edge.

Referring to FIG. 4A, with respect to a geometric center C10 of the main opening 110, the first sub-opening 120 is point symmetric to the third sub-opening 140, and the second sub-opening 130 is point symmetric to the fourth sub-opening 150. The first sub-opening 120 being point symmetric to the third sub-opening 140 means that: by taking the geometric center C10 as a point symmetric center, and after rotating 180° around the geometric center C10, profile positions of the first sub-opening 120 and the third sub-opening 140 before and after the rotation are substantially matched with each other. It is to be explained beforehand that, the sub-openings in the subsequent drawings (FIG. 5A, FIG. 5B, FIG. 7, FIG. 9, FIG. 11, and FIG. 16) are also point symmetric in design. Under such design, with respect to the geometric center C10 of the main opening 110, the first positioning portion 160 is also point symmetric to the second positioning portion 170, and the first elastic portion 180 is also point symmetric to the second elastic portion 190. As such, it is conducive in stably providing the optimal positioning effect to the head portion (or also known as a tail portion) of the probe. In the present embodiment, the first sub-opening 120, the second sub-opening 130, the third sub-opening 140, and the fourth sub-opening 150 are all straight strip-shaped and parallel to each other. A length of the first sub-opening 120 is longer than a length of the second sub-opening 130. In other embodiments, the first sub-opening, the second sub-opening, the third sub-opening, and the fourth sub-opening may also respectively be curved line-shaped, folded line-shaped or other-shaped.

Figure 3:
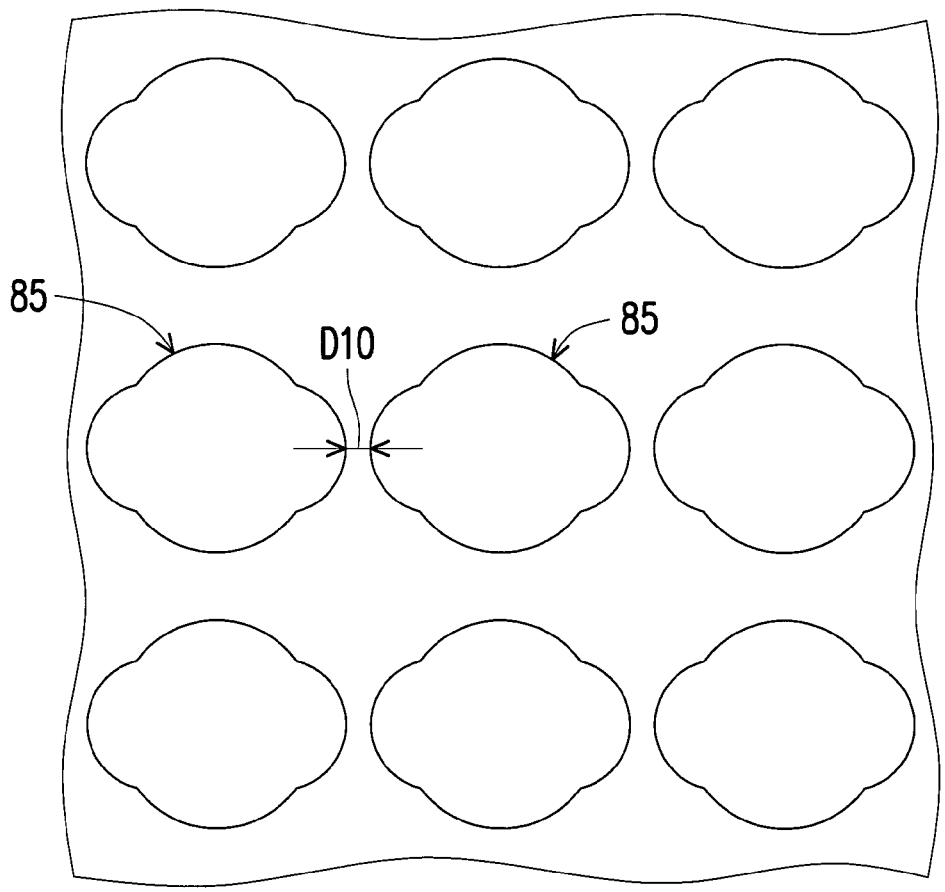
FIG. 3 is a partial top view of a conventional positioner.
Figure 5A:
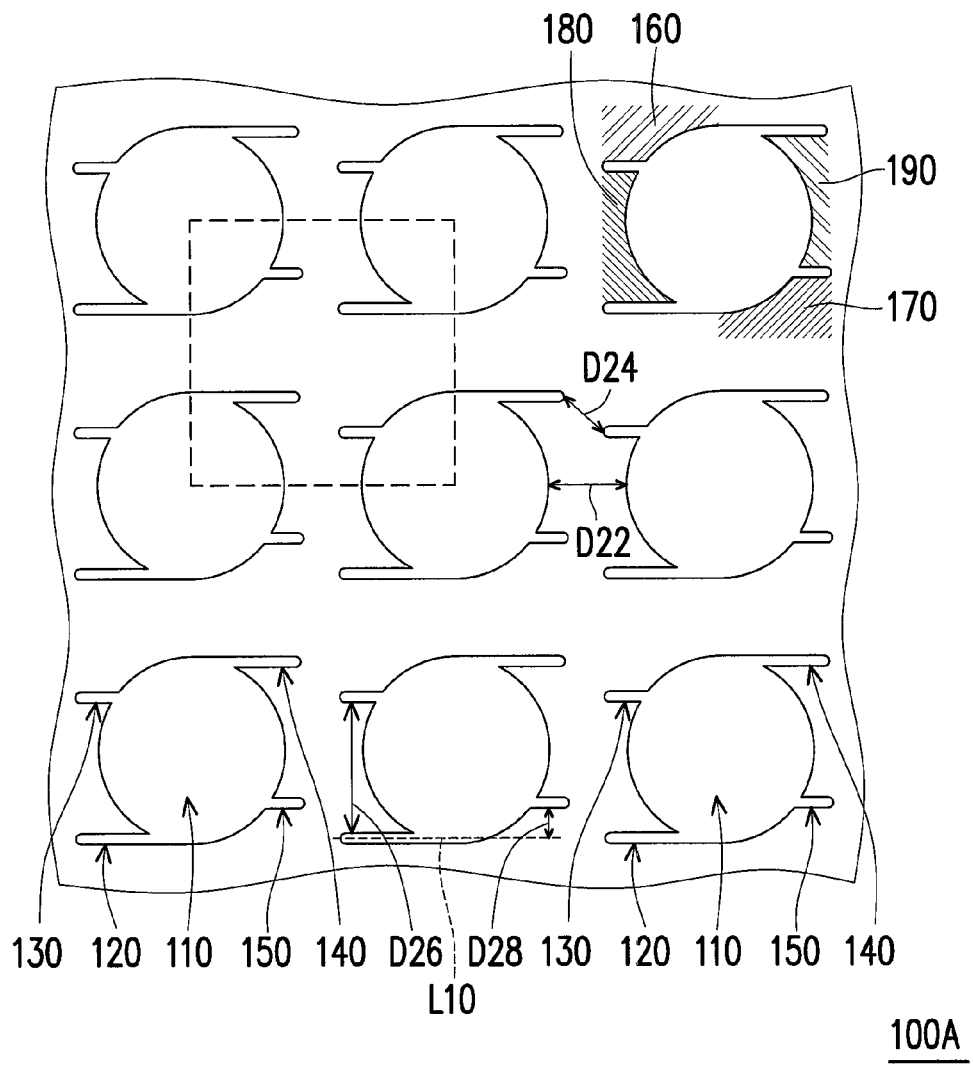
FIG. 5A and FIG. 5B are partial top views respectively illustrating a positioner of a probe card according to another two embodiments of the present invention.

Referring to FIG. 5A, a positioner 100A of a probe card of the present embodiment is similar to the positioner 100 of FIG. 4A, and a difference therebetween lies in that the main openings 110 of the positioner 100A of the present embodiment are arranged into an array, and any four adjacent main openings 110 are arranged into a rectangle. The positioner 100A has a plurality of main openings 110, a plurality of first sub-openings 120, a plurality of second sub-openings 130, a plurality of third sub-openings 140, and a plurality of fourth sub-openings 150. Similar to the positioner 100 of FIG. 4A, each main opening 110 in FIG. 5A is corresponded to one first sub-opening 120, one second sub-opening 130, one third sub-opening 140, and one fourth sub-opening 150, the means of connection and alignment positions thereof are all identical to the ones shown in FIG. 4A, and thus each main opening 110 in FIG. 5A also has a plurality of first positioning portions 160, a plurality of second positioning portions 170, a plurality of first elastic portions 180, and a plurality of second elastic portions 190 that are identical to the ones shown in FIG. 4A. With such design, a shortest distance D22 between these main openings 110 or a shortest distance D24 between these sub-openings is much longer than the distance D10 between the openings 85 of FIG. 3. As a result, the positioner 100A of the probe card of the present embodiment may easily be applied in a probe head of a probe adopting a fine pitch, and when a probe diameter of the probe is increased, the main openings 110 may still able to maintain a sufficient distance therebetween, and thereby will not crack easily.

In the present embodiment, the first sub-opening 120 and the second sub-opening 130 have deviation distance D26 therebetween. Specifically, both ends of the first sub-opening 120 are located on a straight line L10, but both ends of the second sub-opening 130 do not simultaneously on the straight line L10, and thus the first sub-opening 120 and the second sub-opening 130 have the deviation distance D26 therebetween. Moreover, the first sub-opening 120 and the fourth sub-opening 150 have a deviation distance D28 therebetween. Specifically, both ends of the first sub-opening 120 are located on the straight line L10, but both ends of the fourth sub-opening 150 do not simultaneously on the straight line L10, and thus the first sub-opening 120 and the fourth sub-opening 150 have the deviation distance D28 therebetween. Certainly, the both ends of the second sub-opening or the both ends of the fourth sub-opening may also be designed to on the straight line, such that the present invention is not limited to the above embodiment.

Figure 5B:
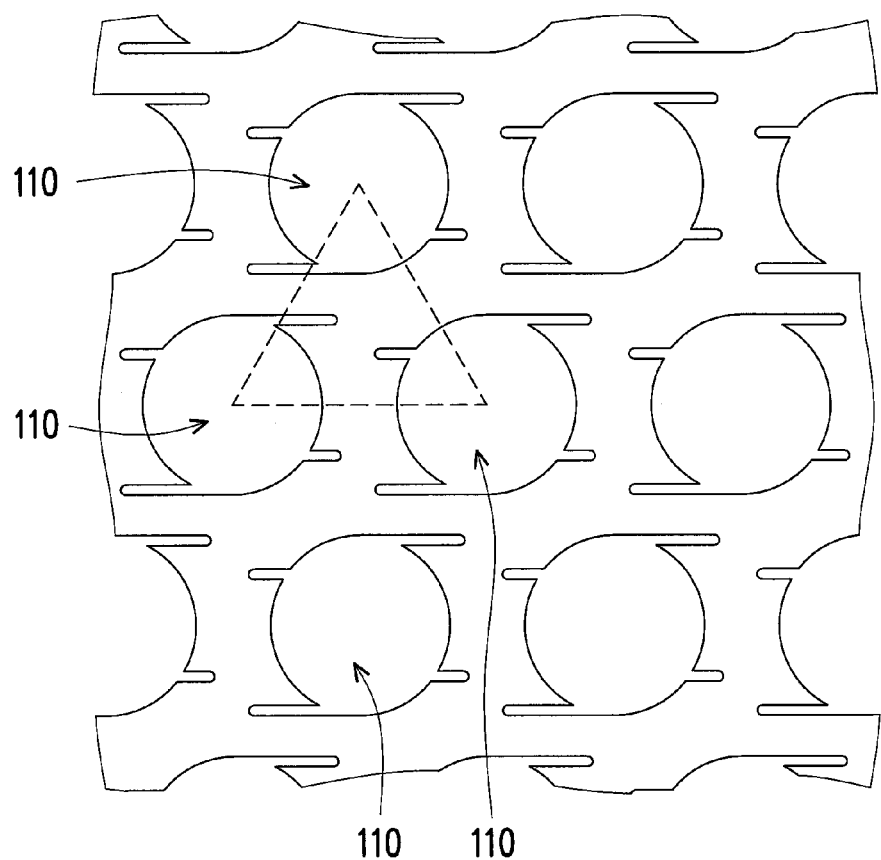

Referring to FIG. 5B, a positioner 100B of a probe card of the present embodiment is similar to the positioner 100 of FIG. 4A and the positioner 100A of FIG. 5A, and a difference therebetween lies in that any three adjacent main openings 110 of the positioner 100B of the present embodiment are arranged into a triangle. With such design, the positioner 100B of the probe card of the present embodiment may be applied in a probe head of a probe adopting different arrangement, and the main openings 110 may still able to maintain a sufficient distance therebetween, and thereby will not crack easily. Certainly, the arrangement (layout of openings) of the main openings on the positioner of the present invention is not limited to the two embodiments described in the above, and may be varied depending on the design of a device under test, the probe diameter of the probe being used, or the difference in material of the positioner, such that a single device under test may include the layout of openings of both embodiments, or include the layout of openings of one of the embodiments in addition with the layout of openings of having only one main opening, etc.; the present invention is not limited thereto.

Figure 6:
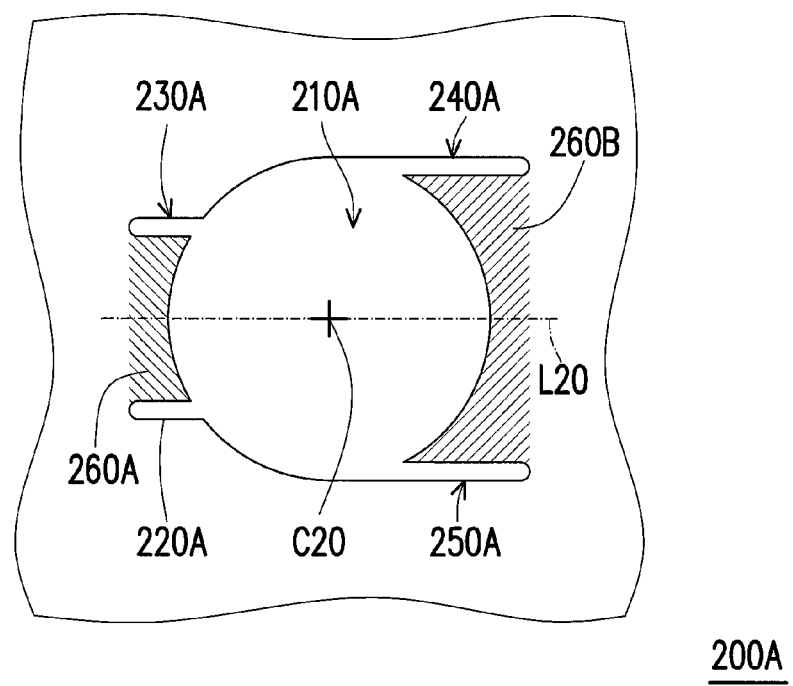
FIG. 6 through FIG. 12 are partial top views respectively illustrating a positioner of a probe card according to another seven embodiments of the present invention.

Referring to FIG. 6, a positioner 200A of a probe card of the present embodiment is similar to the positioner 100 of FIG. 4A, and thus only the differences are to be described herein. A main opening 210A of the positioner 200A of the present embodiment has a symmetry line L20 passing through a geometric center C20 thereof. A first sub-opening 220A and a fourth sub-opening 250A are line symmetric to a second sub-opening 230A and a third sub-opening 240A with respect to a symmetry line L20. The first sub-opening 220A and the fourth sub-opening 250A being line symmetric to the second sub-opening 230A and the third sub-opening 240A means that: by taking the symmetry line L20 as a symmetry line of the line symmetric, after folding the positioner 200A along the symmetry line L20, profile positions of the first sub-opening 220A and the fourth sub-opening 250A are substantially matched with profile positions of the second sub-opening 230A and the third sub-opening 240A. It is to be explained beforehand that, the sub-openings in the subsequent drawings (FIG. 8, FIG. 10, FIG. 12, FIG. 14A, and FIG. 14B) are also line symmetric in design. In the present embodiment, a length of the first sub-opening 220A is shorter than a length of the third sub-opening 240A. Under such design, a stiffness of an elastic portion 260A between the first sub-opening 220A and the second sub-opening 230A would be lower than a stiffness of an elastic portion 260B between the fourth sub-opening 250A and the third sub-opening 240A, and thereby is apt to be deformed but difficult to be damaged.

Figure 7:
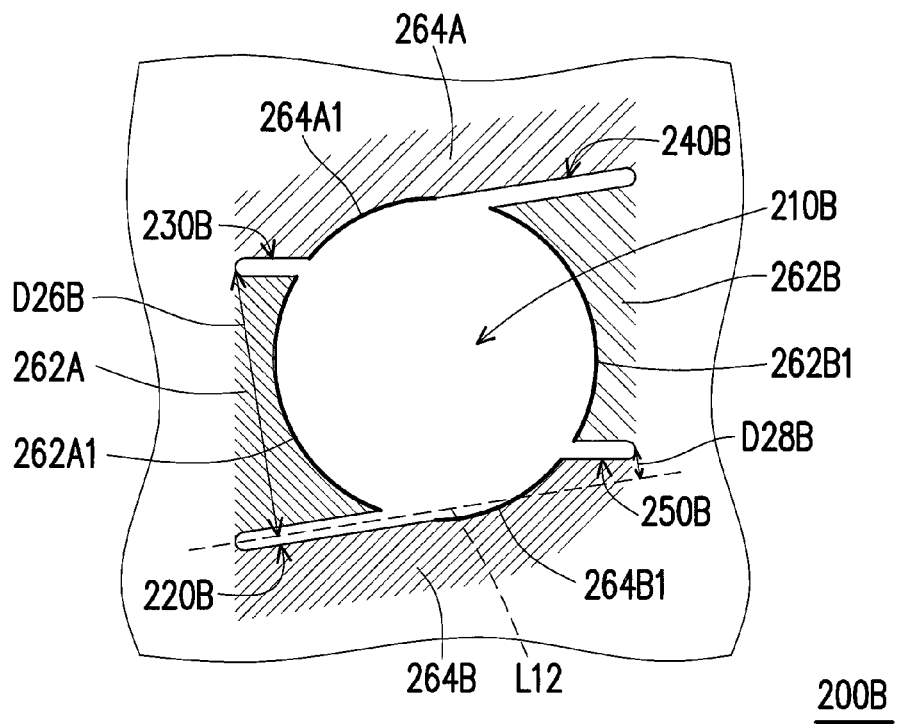

Referring to FIG. 7, a positioner 200B of a probe card of the present embodiment is similar to the positioner 100 of FIG. 4A, and thus only the differences are to be described herein. In the present embodiment, a first sub-opening 220B is parallel to a third sub-opening 240B, and a second sub-opening 230B is parallel to a fourth sub-opening 250B, but the first sub-opening 220B is not parallel to the second sub-opening 230B. A length of the first sub-opening 220B is longer than a length of the second sub-opening 230B. On the other hand, in the present embodiment, a first positioning portion 264A has a first positioning side 264A1 at the periphery of a main opening 210B, a second positioning portion 264B has a second positioning side 264B1 at the periphery of the main opening 210B, a first elastic portion 262A has a first elastic side 262A1 at the periphery of the main opening 210B, and a second elastic portion 262B has a second elastic side 262B1 at the periphery of the main opening 210B. It is to be explained that, technical features regarding the first positioning side 264A1, the second positioning side 264B1, the first elastic side 262A1, and the second elastic side 262B1 can be referred back to the previous embodiment depicted by FIG. 4A, and thus will not be repeated herein. Moreover, in the present embodiment, the first sub-opening 220B and the second sub-opening 230B have a deviation distance D26B therebetween; the first sub-opening 220B and the fourth sub-opening 250B have a deviation distance D28B therebetween; and the technical features regarding the deviation distances D26B and D28B may be referred back to the previous embodiment depicted by FIG. 5A, and thus will not be repeated herein.

Figure 8:
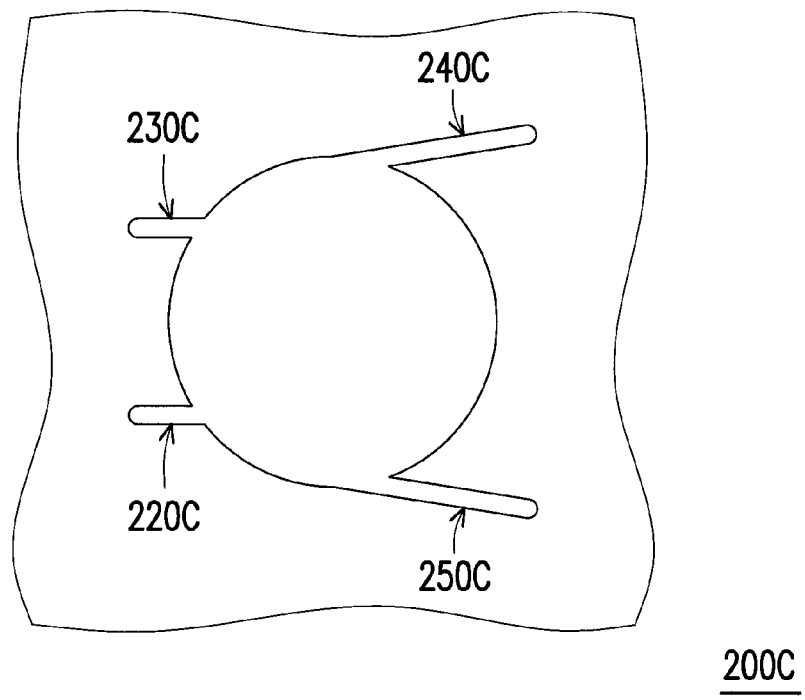

Referring to FIG. 8, a positioner 200C of a probe card of the present embodiment is similar to the positioner 200A of FIG. 6, and thus only the differences are to be described herein. In the present embodiment, a first sub-opening 220C is parallel to a second sub-opening 230C, but a third sub-opening 240C is not parallel to a fourth sub-opening 250C.

Figure 9:
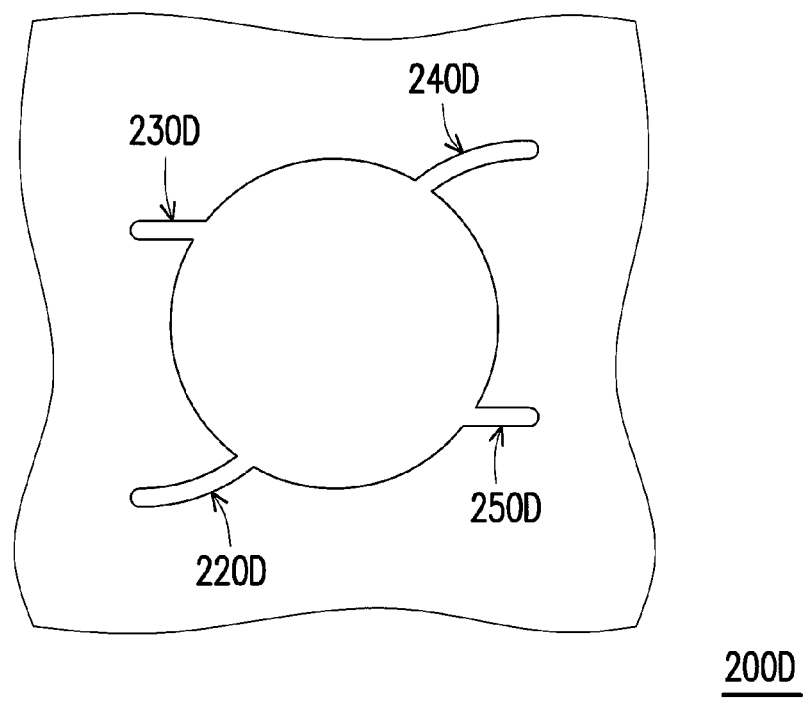

Referring to FIG. 9, a positioner 200D of a probe card of the present embodiment is similar to the positioner 200B of FIG. 7, and thus only the differences are to be described herein. In the present embodiment, a second sub-opening 230D and a fourth sub-opening 250D are straight strip-shaped, and a first sub-opening 220D and a third sub-opening 240D are curved line-shaped.

Figure 10:
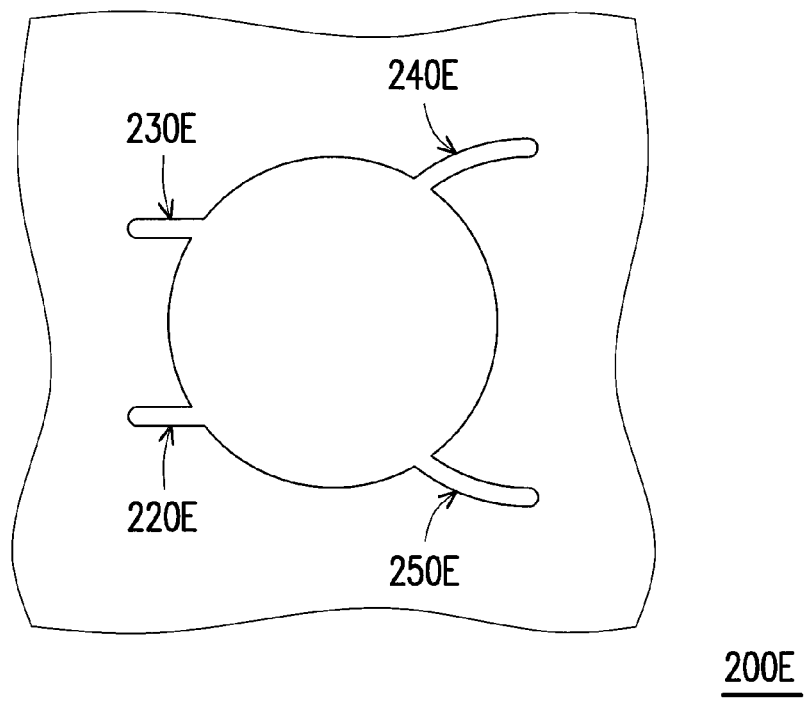

Referring to FIG. 10, a positioner 200E of a probe card of the present embodiment is similar to the positioner 200C of FIG. 8, and thus only the differences are to be described herein. In the present embodiment, a first sub-opening 220E and a second sub-opening 230E are straight strip-shaped, and a third sub-opening 240E and a fourth sub-opening 250E are curved line-shaped.

Figure 11:
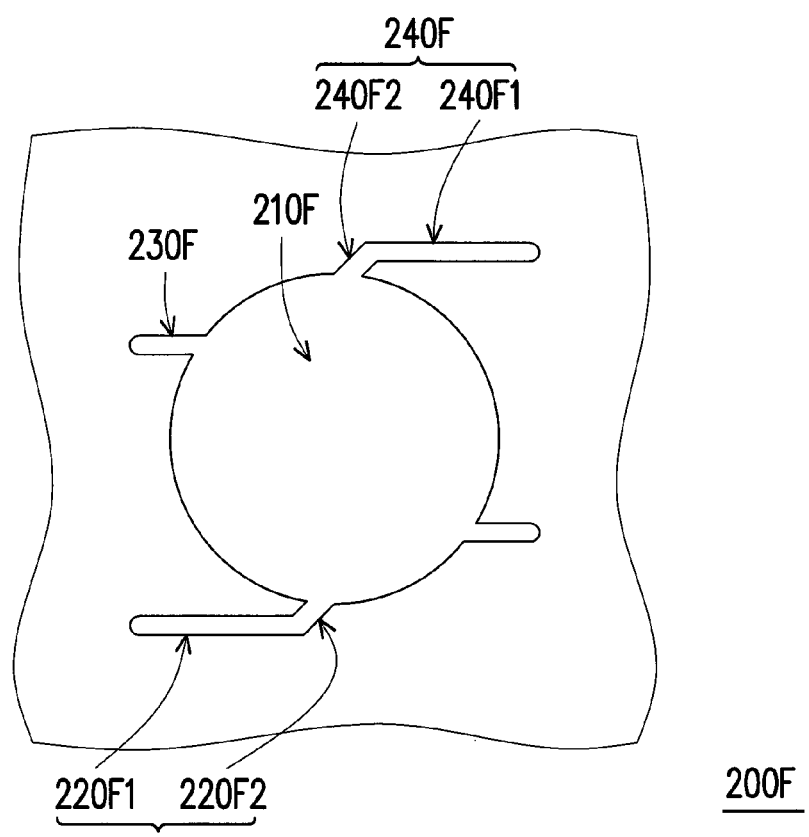

Referring to FIG. 11, a positioner 200F of a probe card of the present embodiment is similar to the positioner 200B of FIG. 7, and thus only the differences are to be described herein. In the present embodiment, a first sub-opening 220F and a third sub-opening 240F are folded line-shaped, namely, respectively include two connected straight line portions 220F1 and 220F2, and 240F1 and 240F2. The portion 220F1 of the first sub-opening 220F that is away from the main opening 210F is parallel to the second sub-opening 230F, while the portion 220F2 of the first sub-opening 220F that is close to the main opening 210F is not parallel to the second sub-opening 230F.

Figure 12:
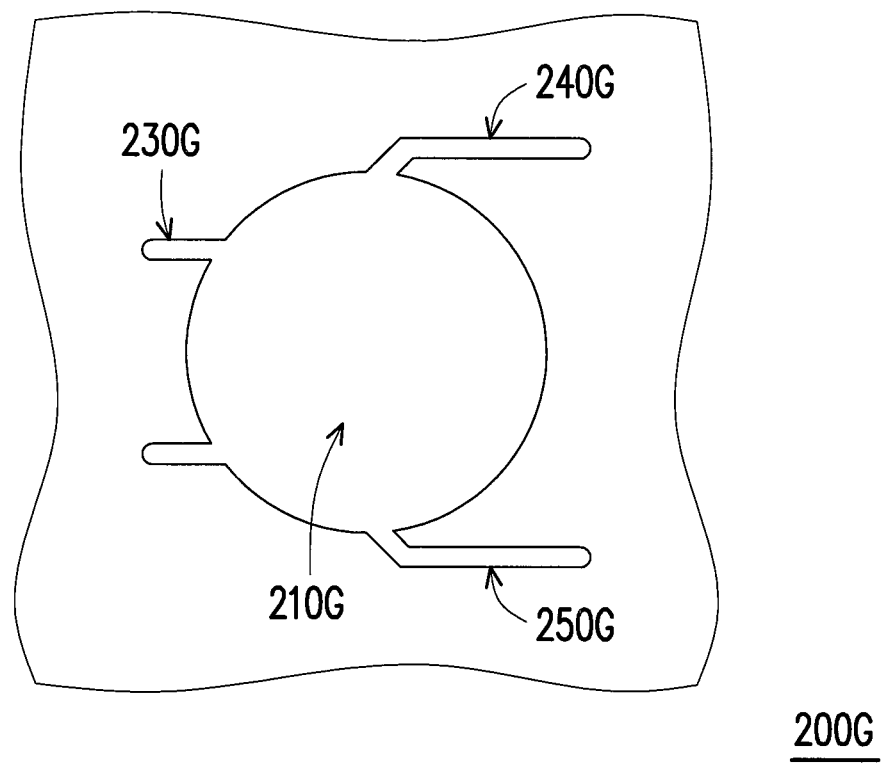

Referring to FIG. 12, a positioner 200G of the probe card of the present embodiment is similar to the positioner 200C of FIG. 8, and thus only the differences are to be described herein. In the present embodiment, a third sub-opening 240G and a fourth sub-opening 250G are folded line-shaped, namely, respectively include two connected straight line portions. A portion of the third sub-opening 240G that is away from the main opening 210G is parallel to the fourth sub-opening 250G, while a portion of the third sub-opening 240G that is close to the main opening 210G is not parallel to the fourth sub-opening 250G.

Figure 13:
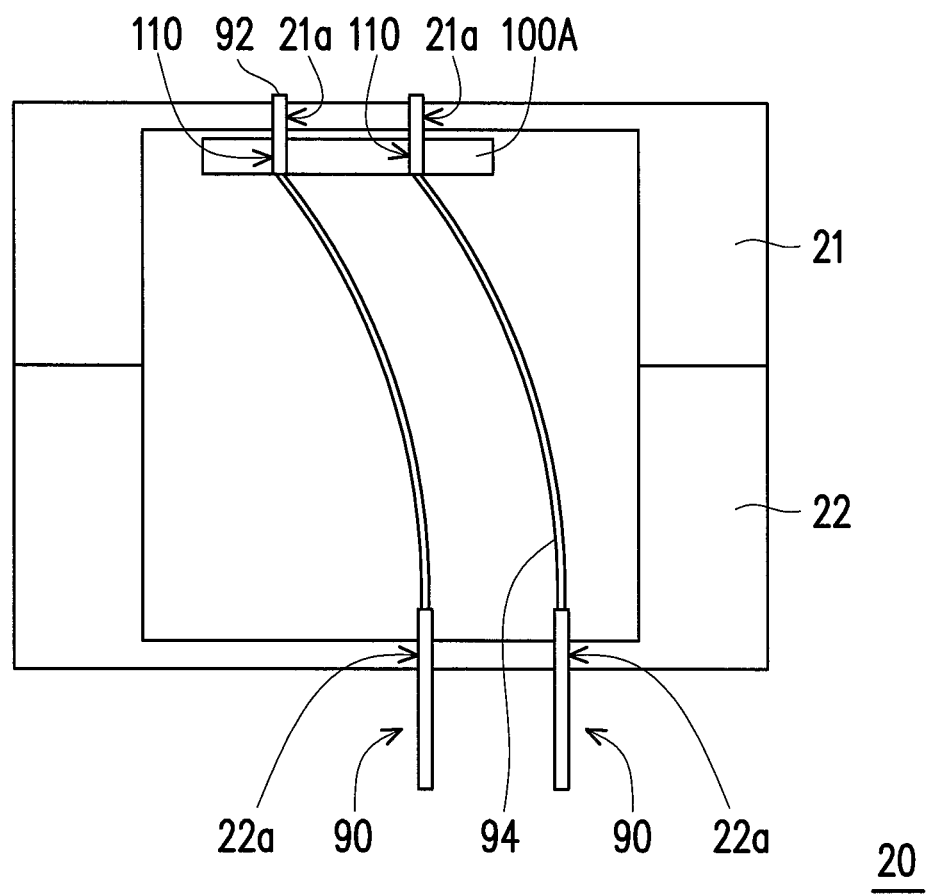
FIG. 13 is a perspective view illustrating a probe head of a probe card according to an embodiment of the present invention.

Referring to FIG. 13 and FIG. 5A, a probe head 20 of the present embodiment is, for example, adapted to be used in a vertical probe card for electrically connecting a circuit board (such as a printed circuit board or a space transformer) of the vertical probe card to at least one device under test. Specifically, the probe head 20 includes an upper guide plate 21, a lower guide plate 22, a positioner 100A, and a plurality of probes 90. The upper guide plate 21 has a plurality of upper through holes 21a. The lower guide plate 22 has a plurality of lower through holes 22a. The positioner 100A is located between the upper guide plate 21 and the lower guide plate 22. Each probe 90 is positioned between one upper through hole 21a of the upper guide plate 21 and one lower through hole 22a of the lower guide plate 22 and passes through the main opening 110 of the positioner 100A. Certainly, the positioner 100A may also be replaced by any positioner described in the other embodiments of the present invention. In addition, it is to be explained that, these probes 90 may be produced by micro electro mechanical systems (MEMS) processing (namely, may be referred to as MEMS probes), or be made of wires through mechanical stamping (namely, may be referred to as molded probes).

In the positioners of the probe cards as described in the above, each main opening is, for example, corresponded to the sub-openings of two positioning portions and two elastic portions, but the positioners of the probe cards of the present invention are not limited thereto, such that each main opening may also be corresponded to the sub-openings of only one positioning portion and one elastic portion, or each main opening may also be corresponded to the sub-openings of much more positioning portions and much more elastic portions. In the following below, several embodiments are provided for describing a design whereby each main opening is corresponded to the sub-openings of one positioning portion and one elastic portion. Moreover, the technical features regarding the positioners of the probe cards of the present invention and the probe heads adopting the said positioners can be referred back to the previous embodiments, such that similar contents regarding thereof will not be repeated in the following embodiments.

Figure 14A:
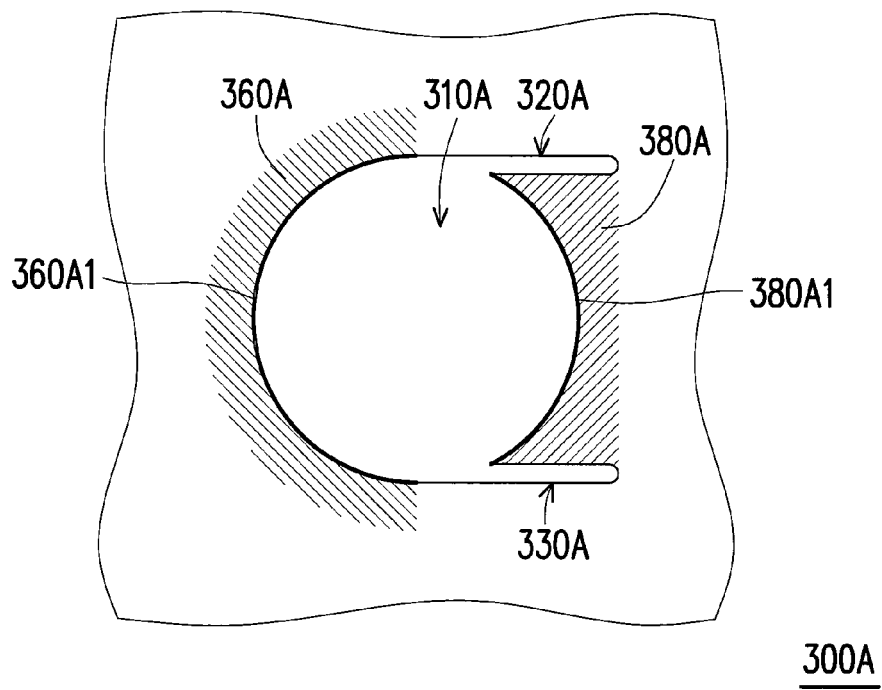
FIG. 14A and FIG. 14B are partial top views respectively illustrating a positioner of a probe card according to another two embodiments of the present invention.

Referring to FIG. 14A, a positioner 300A of a probe card of the present embodiment has a main opening 310A, a first sub-opening 320A, a second sub-opening 330A, a positioning portion 360A, and an elastic portion 380A. The first sub-opening 320A and the second sub-opening 330A are arranged at the periphery of the main opening 310A, and the first sub-opening 320A and the second sub-opening 330A are both communicated to the main opening 310A. The elastic portion 380A is between the first sub-opening 320A and the second sub-opening 330A. The positioning portion 360A and the elastic portion 380A are complementary of each other, namely, the positioning portion 360A and the elastic portion 380A together constitute the entire periphery of the main opening 310A. Taking the present embodiment as an example, the positioning portion 360A and the elastic portion 380A together constitute the entire periphery of the main opening 310A, except the portions that are communicated to the first sub-opening 320A and the second sub-opening 330A. A stiffness of the positioning portion 360A is higher than a stiffness of the elastic portion 380A. A positioning side 360A1 provided at the periphery of the main opening 310A by the complementary positioning portion 360A and an elastic side 380A1 provided at the periphery of the main opening 310A by the complementary elastic portion 380A may together provide the probe with favorable positioning effect.

Figure 14B:
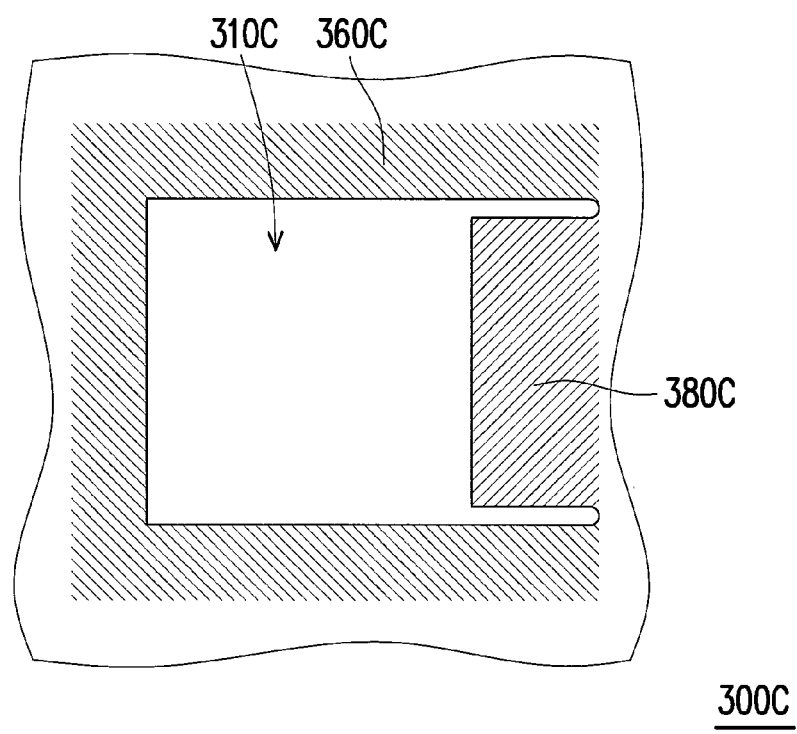
Figure 15:
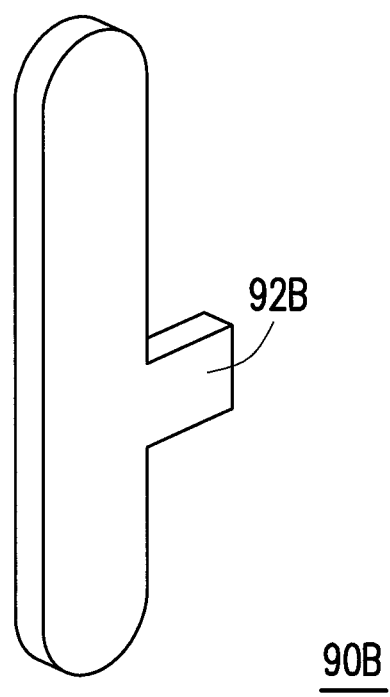
FIG. 15 is a schematic view illustrating a probe adapted to be used in the positioner of the probe card depicted in the embodiments of the present invention.

Referring to FIG. 14B, a positioner 300C of a probe card of the present embodiment is similar to the positioner 300A of FIG. 14A, and thus only the differences are to be described herein. A shape of a main opening 310C of the positioner 300C of the present embodiment generally matches a cross-sectional shape of a head portion of a probe that is to be constrained, such as being a rectangle. The positioning portion 360C and the elastic portion 380C that are complementary of each other may also together provide favorable positioning effect to the probe, and the elastic portion 380C may elastically be deformed to avoid damaging the probe. In the present embodiment, the shape of the main opening 310C of the positioner 300C is a rectangle, which may be used for a MEMS probe 90B as shown in FIG. 15. When a stopper portion 92B of the MEMS probe 90B passes through the main opening 310C, the elastic portion 380C as being oppressed by the stopper portion 92B would be elastically deformed, and then the elastic portion 380C would return to the original state after the stopper portion 92B leaves the main opening 310C.

Figure 16:
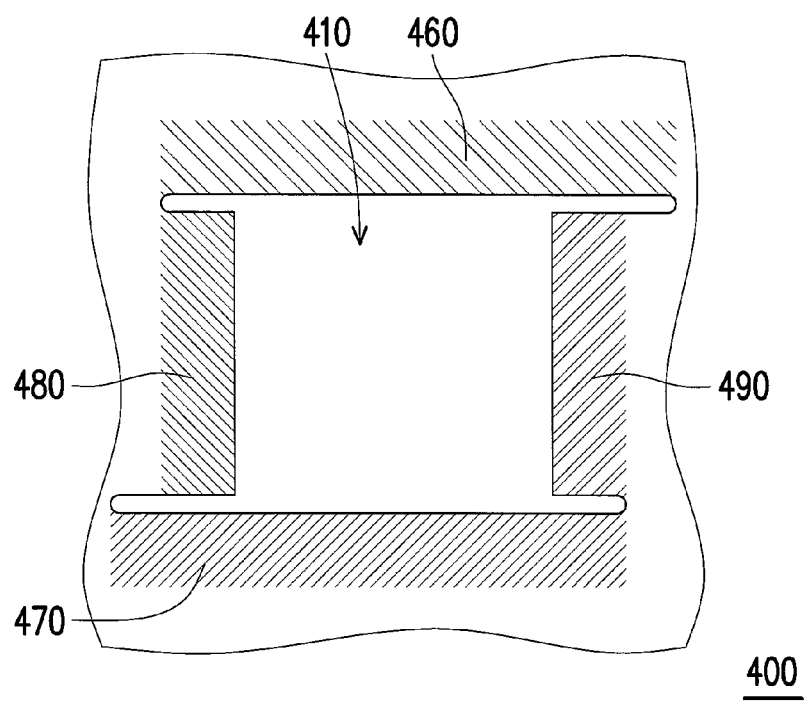
FIG. 16 is a partial top view illustrating a positioner of a probe card according to another embodiment of the present invention.
Figure 17:
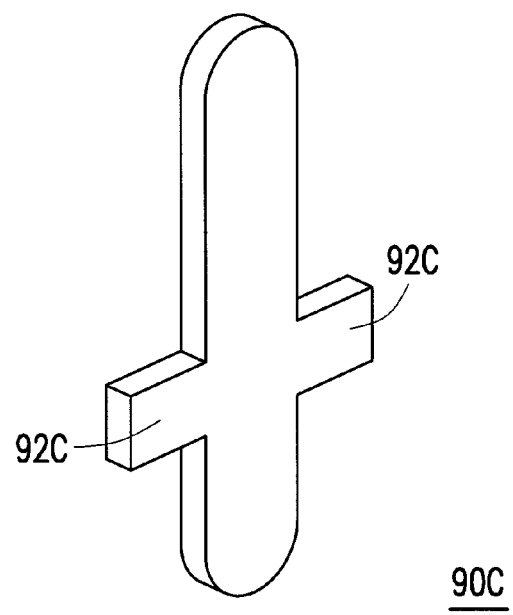
FIG. 17 is a schematic view illustrating another probe adapted to be used in the positioner of the probe card depicted in the embodiments of the present invention.

Referring to FIG. 16, a positioner 400 of a probe card of the present embodiment is similar to the positioner 100 of FIG. 4A, and thus only the differences are to be described herein. A shape of a main opening 410 of the positioner 400 of the present embodiment generally matches a cross-sectional shape of a head portion of a probe that is to be constrained, such as being a rectangle. A first positioning portion 460, a second positioning portion 470, a first elastic portion 480, and a second elastic portion 490 that are complementary of each other may also together provide favorable positioning effect to the probe, and the first elastic portion 480 and the second elastic portion 490 may be elastically deformed to avoid damaging the probe. In the present embodiment, the shape of the main opening 410 of the positioner 400 is a rectangle, which may be used for a MEMS probe 90C as shown in FIG. 17. When two stopper portions 92C of the MEMS probe 90C pass through the main opening 410, the first elastic portion 480 and the second elastic portion 490 as being respectively oppressed by the stopper portions 92C would be elastically deformed, and then the first elastic portion 480 and the second elastic portion 490 would return back to the original state after the stopper portions 92C leave the main opening 410. The first positioning portion 460 and the second positioning portion 470 appear to be oppositely disposed, and the first elastic portion 480 and the second elastic portion 490 appear to be oppositely disposed.

In summary, in the present invention, the positioning portion and the elastic portion of the positioner that are complementary of each other may simultaneously provide the probe with favorable positioning effect, and the elastic portion between the sub-openings may provide a suitable deformation margin when being passed by the probe, so as to prevent the probe from being damaged due to excessive friction. At the same time, the strength between the main openings of the positioner is also enhanced as the distance therebetween increases, thereby preventing the distance between the main openings from cracking. Accordingly, the difficulty in assembling the probe head of the probe card is lowered, and the product yield of the probe head of the probe card is increased.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A positioner of a probe card, the positioner having a main opening, a first sub-opening, a second sub-opening, a third sub-opening, a fourth sub-opening, a first positioning portion, a second positioning portion, a first elastic portion and a second elastic portion, the first sub-opening, the second sub-opening, the third sub-opening, and the fourth sub-opening are sequentially arranged at the periphery of the main opening and communicated to the main opening, the first elastic portion is between the first sub-opening and the second sub-opening, the first positioning portion is between the second sub-opening and the third sub-opening, the second elastic portion is between the third sub-opening and the fourth sub-opening, the second positioning portion is between the first sub-opening and the fourth sub-opening, and a stiffness of the first positioning portion and a stiffness of the second positioning portion are higher than a stiffness of the first elastic portion and a stiffness of the second elastic portion.

2. The positioner of the probe card as recited in claim 1, wherein the first positioning portion and the second positioning portion appear to be oppositely disposed, and the first elastic portion and the second elastic portion appear to be oppositely disposed.

3. The positioner of the probe card as recited in claim 1, wherein the first sub-opening, the second sub-opening, the third sub-opening, and the fourth sub-opening are respectively straight strip-shaped, curved line-shaped or folded line-shaped.

4. The positioner of the probe card as recited in claim 3, wherein an end of the first sub-opening, an end of the second sub-opening, an end of the third sub-opening, and an end of the fourth sub-opening that are away from the main opening respectively have an arc-shaped edge.

5. The positioner of the probe card as recited in claim 1, wherein the first sub-opening and the fourth sub-opening have a deviation distance therebetween, or the first sub-opening and the second sub-opening have a deviation distance therebetween.

6. The positioner of the probe card as recited in claim 1, wherein the first positioning portion has a first positioning side at the periphery of the main opening, the second positioning portion has a second positioning side at the periphery of the main opening, the first elastic portion has a first elastic side at the periphery of the main opening, the second elastic portion has a second elastic side at the periphery of the main opening, and the first positioning side, the second positioning side, the first elastic side, and the second elastic side are configured to support a probe.

7. The positioner of the probe card as recited in claim 6, wherein a sum of side lengths of the first elastic side and the second elastic side is greater than or equal to a sum of side lengths of the first positioning side and the second positioning side.

8. The positioner of the probe card as recited in claim 1, wherein the first sub-opening and the second sub-opening are parallel to each other, or the first sub-opening and the third sub-opening are parallel to each other.

9. The positioner of the probe card as recited in claim 1, wherein the first sub-opening and the second sub-opening are line symmetric to each other with respect to a symmetry line passing through a geometric center of the main opening, or the first sub-opening and the third sub-opening are point symmetric to each other with respect to the geometric center of the main opening.

10. The positioner of the probe card as recited in claim 9, wherein the first sub-opening is point symmetric to the third sub-opening, and the second sub-opening is point symmetric to the fourth sub-opening.

11. The positioner of the probe card as recited in claim 9, wherein the first sub-opening and the third sub-opening are point symmetric, the second sub-opening and the fourth sub-opening are point symmetric, and a length of the first sub-opening is longer than or equal to a length of the second sub-opening.

12. The positioner of the probe card as recited in claim 9, wherein the first sub-opening and the second sub-opening are line symmetric, the third sub-opening and the fourth sub-opening are line symmetric, and a length of the first sub-opening is shorter than or equal to a length of the third sub-opening.

13. The positioner of the probe card as recited in claim 1, having plurality of the main openings, plurality of the first sub-openings, plurality of the second sub-openings, plurality of the third sub-openings, plurality of the fourth sub-openings, plurality of the first positioning portions, plurality of the second positioning portions, plurality of the first elastic portions, and plurality of the second elastic portions, wherein each main opening is communicated to one corresponding first sub-opening, one corresponding second sub-opening, one corresponding third sub-opening, and one corresponding fourth sub-opening, the main openings are arranged into an array, and any four adjacent main openings are arranged into a rectangle.

14. The positioner of the probe card as recited in claim 1, having plurality of the main openings, plurality of the first sub-openings, plurality of the second sub-openings, plurality of the third sub-openings, plurality of the fourth sub-openings, plurality of the first positioning portions, plurality of the second positioning portions, plurality of the first elastic portions, and plurality of the second elastic portions, wherein each main opening is communicated to one corresponding first sub-opening, one corresponding second sub-opening, one corresponding third sub-opening, and one corresponding fourth sub-opening, the main openings are arranged into an array, and any three adjacent main openings are arranged into a triangle.

15. A probe head of a probe card, the probe head comprising:
 an upper guide plate having a plurality of upper through holes;
 a lower guide plate located at a side of the upper guide plate and having a plurality of lower through holes;
 a positioner of the probe card as recited in claim 1, the positioner being between the upper guide plate and the lower guide plate and having plurality of the main openings; and
 a plurality of probes being positioned between the upper through holes of the upper guide plate and the lower through holes of the lower guide plate, and passing through the main openings of the positioner.

* * * * *